United States Patent
Yamaguchi et al.

(10) Patent No.: US 6,507,103 B2
(45) Date of Patent: Jan. 14, 2003

(54) SEMICONDUCTOR DEVICE

(75) Inventors: Yasuo Yamaguchi, Tokyo (JP); Kunihiro Nakamura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/127,711

(22) Filed: Apr. 23, 2002

(65) Prior Publication Data

US 2002/0180031 A1 Dec. 5, 2002

(30) Foreign Application Priority Data

Jun. 1, 2001 (JP) ........................................ 2001-166821

(51) Int. Cl.$^7$ .............................................. H01L 23/10
(52) U.S. Cl. .................... 257/710; 257/704; 257/417
(58) Field of Search .................. 257/419, 417, 257/710, 704

(56) References Cited

U.S. PATENT DOCUMENTS

| | | | | |
|---|---|---|---|---|
| 4,524,238 A | * | 6/1985 | Butt | |
| 4,784,974 A | * | 11/1988 | Butt | |
| 5,317,478 A | * | 5/1994 | Sobhani | |
| 5,770,890 A | * | 6/1998 | Dreyer et al. | |
| 5,945,735 A | * | 8/1999 | Economikos et al. | |
| 6,441,450 B1 | * | 8/2002 | Yamagishi et al. | |

* cited by examiner

Primary Examiner—Sheila V. Clark
(74) Attorney, Agent, or Firm—Oblon, Spivak, McClelland, Maier & Neustadt, P.C.

(57) ABSTRACT

In order to provide a semiconductor device which has a bonding layer capable of providing electrical continuity between the cap and the semiconductor substrate, the semiconductor device comprises a semiconductor substrate whereon an element is formed on one principal plane thereof and a cap which hermetically seals the element so that a space is formed over the element, while the element is sealed by bonding a laminated bonding layer, which is formed around the element provided on the principal plane, and an Ni layer formed on the cap, wherein the laminated bonding layer is constituted from a first polysilicon layer which is doped with an impurity, an insulation layer and a second polysilicon layer which is not doped with an impurity, while the first polysilicon layer and the second polysilicon layer contact with each other in a part thereof so that the impurity diffuses through the contact area from the first polysilicon layer into the second polysilicon layer.

5 Claims, 4 Drawing Sheets

SEMICONDUCTOR DEVICE

BACKGROUND OF THE INVENTION

1. Field of the Invention

The present invention relates to a semiconductor device wherein a semiconductor substrate is hermetically sealed with a cap.

2. Description of the Related Art

A capacitive acceleration sensor, for example, of the prior art has been made in such a constitution as an acceleration sensor element 1 formed on a semiconductor substrate 3 is hermetically sealed with a cap 5 so that a space is formed over the element 1, as shown in FIG. 6. The semiconductor substrate 3 and the cap 5 are generally bonded with each other by bringing polysilicon layer formed around the semiconductor substrate 3 and an Ni layer 4 formed around the cap 5 into contact with each other, and heating to a temperature above the eutectic temperature of Ni and silicon. With this bonding method, since the polysilicon layer 23 formed on the semiconductor substrate 3 for the purpose of bonding is formed simultaneously with the polysilicon layer which is formed as a conductor for the acceleration sensor element, the polysilicon layer is doped with an impurity of phosphorus. As a result, there has been such a problem that direct bonding of the polysilicon layer 23 and Ni is impeded by the diffusion of phosphorus into Ni caused by the heat generated during bonding.

Therefore, the bonding method of the prior art has been employing such a process as an insulation film 22a which prevents the diffusion of phosphorus is formed on the phosphorus-doped polysilicon layer 23 that has been formed simultaneously with the polysilicon layer of the acceleration sensor element, then a polysilicon layer 21 which is not doped with phosphorus is formed on the insulation film 22a, then the polysilicon layer 21 is bonded with the Ni layer 4.

With the method of the prior art, however, the cap 5 is isolated from ground (not grounded) since the phosphorus-doped polysilicon layer 23 and the polysilicon layer 21 which is not doped with phosphorus are electrically insulated from each other by the insulation film 22a. Thus there has been such a problem that the acceleration sensor is prone to external noise such as electrostatic or electromagnetic interference.

Accordingly, such measures has been taken in the prior art as a metal film 6 is formed on the cap 5 with the metal film being connected to an external ground conductor by means of wiring so as to ground the cap, as shown in FIG. 6, thus providing protection against the external noise such as electrostatic or electromagnetic interference.

SUMMARY OF THE INVENTION

It is therefore an object of the present invention to provide a semiconductor device which has a bonding layer capable of providing electrical continuity between the cap and the semiconductor substrate and provides good bonding.

In order to achieve the object described above, the semiconductor device of the present invention comprises a semiconductor substrate whereon an element is formed on one of the principal planes thereof and a cap which hermetically seals the element so that a space is formed over the element, while the element is sealed by bonding a laminated bonding layer, which is formed around the element provided on one of the principal planes of the semiconductor substrate, and an Ni layer formed on the cap, wherein the laminated bonding layer is constituted from a first polysilicon layer which is doped with an impurity, an insulation layer and a second polysilicon layer which is not doped with an impurity being formed one on another, while the first polysilicon layer and the second polysilicon layer contact with each other in a part thereof so that the impurity diffuses through the contact area from the first polysilicon layer into the second polysilicon layer.

In the semiconductor device of the present invention having such a constitution as described above, since a current path is formed in the semi-insulating second polysilicon layer which is not doped with the impurity, by the impurity which has diffused from the first polysilicon layer, electrical continuity can be established between the first polysilicon layer which has electrical conductivity formed on the semiconductor substrate and the Ni layer of the cap.

In the semiconductor device of the present invention, in order to achieve reliable continuity between the first polysilicon layer and the cap, it is desirable that the first polysilicon layer and the second polysilicon layer contact with each other at two or more separate points.

Also in the semiconductor device of the present invention, in order to reduce the resistance of the current path between the first polysilicon layer and the cap, it is more desirable that the laminated bonding layer is provided so as to surround the element and the first polysilicon layer and the second polysilicon layer contact with each other through a ring-shaped contact area provided on the inner or outer circumference of the laminated bonding layer.

In case the element of the semiconductor device of the present invention is constituted to include a polysilicon layer, this polysilicon layer and the first polysilicon layer can be formed in the same process.

In the semiconductor device of the present invention, the cap can be formed from silicon.

DETAILED DESCRIPTION OF THE PREFERRED EMBODIMENTS

Now the semiconductor device according to the preferred embodiments of the invention will be described below with reference to the accompanying drawings.

Embodiment 1

The semiconductor device according to the first embodiment of the invention is a semiconductor acceleration sensor comprising a semiconductor substrate 3 whereon an acceleration sensor element 1 is formed on one of the principal planes thereof and a cap which seals the element so that a sealed space is formed over the acceleration sensor element 1, the semiconductor substrate 3 and the cap being bonded with each other, having such a constitution as described in detail below.

Figure 1:
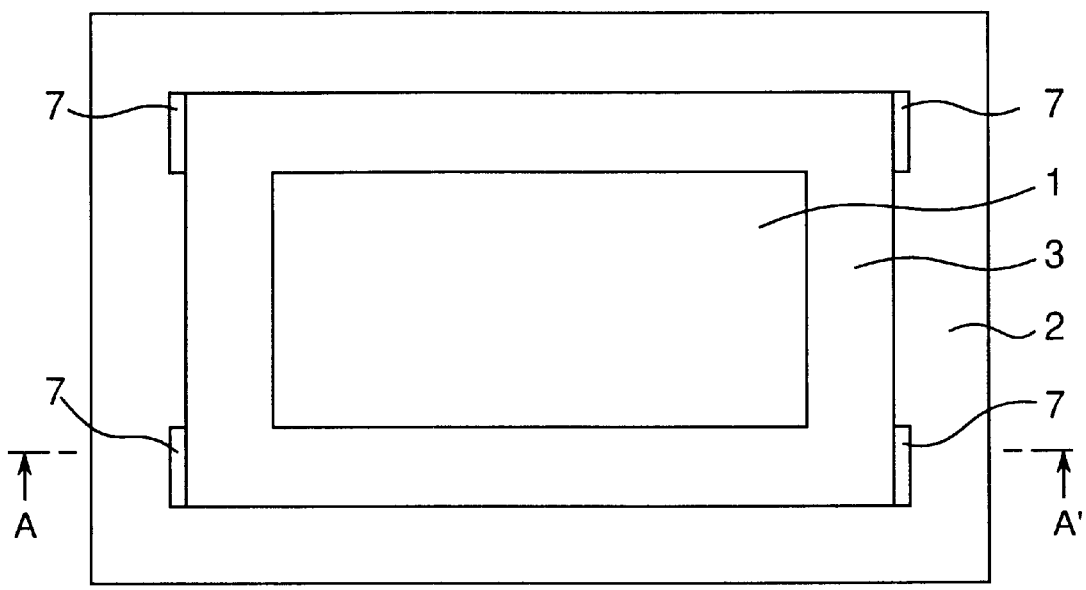
FIG. 1 is a plan view of the semiconductor substrate in the semiconductor device according to the first embodiment of the invention.
Figure 2:
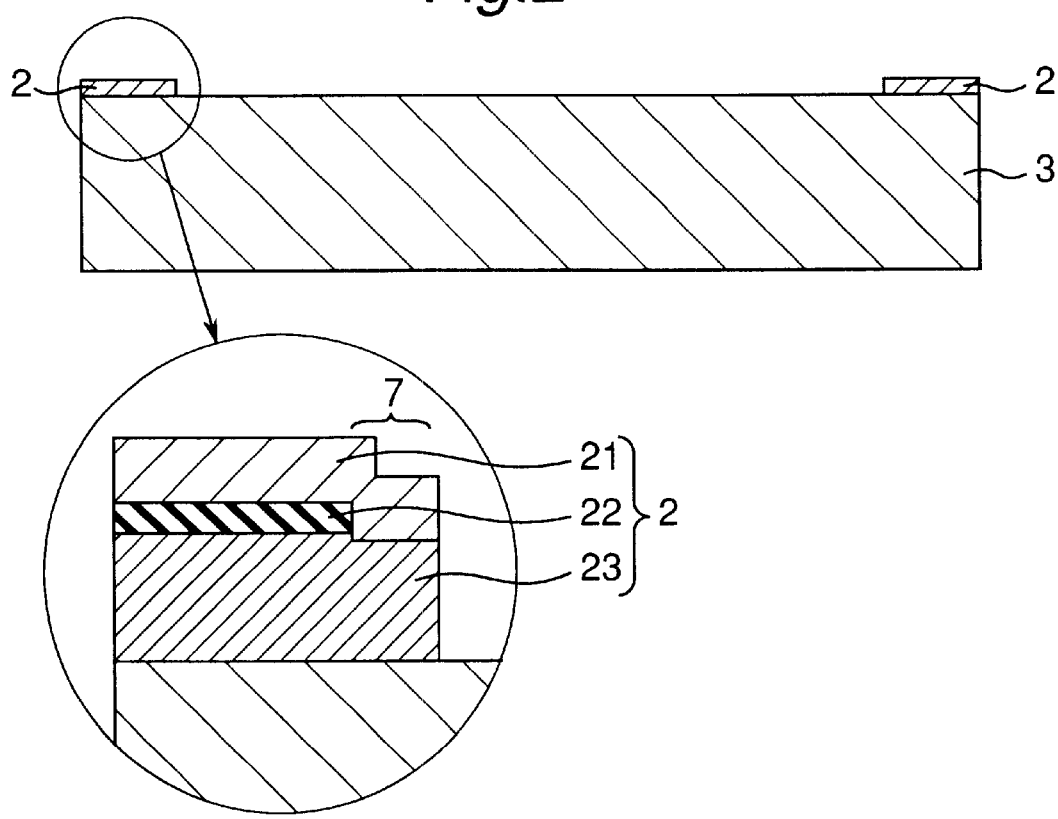
FIG. 2 is a sectional view taken along lines A—A' in FIG. 1 and an enlarged view showing a part of the sectional view.

According to the first embodiment, the acceleration sensor element 1 is formed at the center of one of the principal planes of the semiconductor substrate 3 which is made of silicon, and a bonding frame 2 is formed so as to surround the acceleration sensor element 1 (FIG. 1).

The bonding frame 2 is, similarly to the prior art, a laminated bonding layer having such a constitution as a first polysilicon layer 23 which is doped with an impurity, for example phosphorus, an insulation layer 22 made of, for example, $SiO_2$ or $SiN_4$, and a second polysilicon layer 21 which is not doped with an impurity are formed one on another, while the insulation layer 22 prevents the impurity that is doped in the first polysilicon layer 23 from diffusing into the second polysilicon layer 22.

According to the invention, in particular, the first polysilicon layer 23 and the second polysilicon layer 21 contact with each other through a part thereof in the laminated bonding layer 2, so that heat treatment process causes the impurity doped in the first polysilicon layer 23 to diffuse into the second polysilicon layer 21 via the contact area 7, thereby forming a current path having electrical continuity on the second polysilicon layer 21 which is not electrically conductive.

In the semiconductor device of the first embodiment, the contact areas 7 are provided at four corners of the inner circumference of the laminated bonding layer 2.

It is desirable that the laminated bonding layer 2 has a width in a range from 150 to 200 μm in order to ensure sufficient bonding strength, and the contact area 7 has a width of 5 μm or larger in order to ensure electrical continuity of the current path which is required, and not larger than 20 μm in order to ensure sufficient bonding strength.

According to the first embodiment, the first polysilicon layer of the laminated bonding layer 2 is formed simultaneously with the polysilicon layer (the layer doped with an impurity such as phosphorus which renders electrical conductivity) that constitutes the conductor of the acceleration sensor element and, after forming the insulation layer 22 and the second polysilicon layer 21, heat treatment (for example, at 1000° C. for several minutes) is applied for the purpose of making the impurity concentration in the polysilicon layer which constitutes the conductor of the acceleration sensor uniform, thereby causing the impurity of the first polysilicon layer to diffuse into the second polysilicon layer via the contact area 7.

According to the invention, gallium, boron, arsenic or the like may also be used, instead of phosphorus mentioned above, as the impurity of the first polysilicon layer.

Thickness of the constituent layer of the laminated bonding layer 2 is set to, for example, 35000 Å for the first polysilicon layer 23, 1000 Å for the insulation layer 22 and 5500 Å for the second polysilicon layer 21. Thickness of the first polysilicon layer 23 is determined from the necessity to constitute the conductor of the acceleration sensor.

Figure 3:
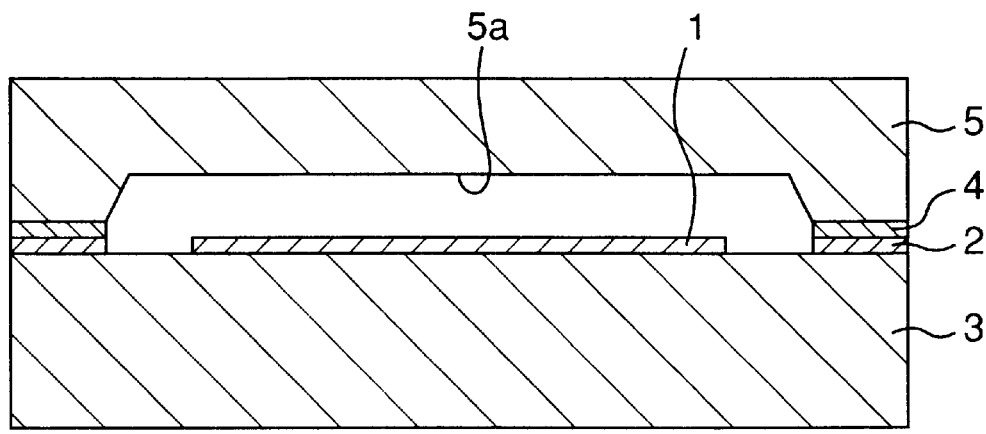
FIG. 3 is a sectional view of the semiconductor substrate according to the first embodiment.
Figure 4:
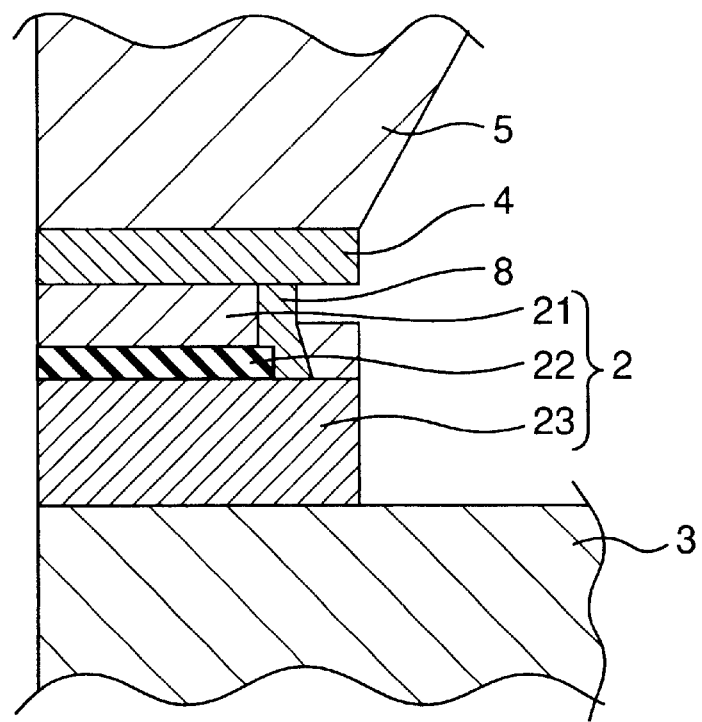
FIG. 4 is a sectional view showing a part of FIG. 3 in an enlarged view.

In this embodiment, the cap 5 has a recess 5a formed therein so as to provide a space over the acceleration sensor element when the cap is fitted with the semiconductor substrate 3 as shown in FIG. 3, and a bonding layer 4 is formed around the recess 5a so as to oppose the laminated bonding layer 2 of the semiconductor substrate 3. The cap 5 is made of a metal, for example, and the bonding layer 4 is made by forming a Ti layer on the cap 5 and forming an Ni layer on the Ti layer.

Thickness of the constituent layer of the bonding layer 4 is set to several tens of micrometers for the Ti layer and several hundreds of micrometers for the Ni layer, by giving consideration to the bonding strength of the semiconductor substrate 3 and the laminated bonding layer, and to the residual stress generated by forming the Ti layer and the Ni layer.

According to the present invention, material of the cap 5 is not limited to a metal, and various materials may be used such as a ceramic substrate coated with a metal film to have electrical conductivity on the surface, a silicon substrate coated with a metal film or a silicon substrate doped with an impurity to have electrical conductivity.

In case the cap 5 of the present invention is made of silicon, the recess to provide the sealed space can be formed easily with a high dimensional accuracy by using anisotropic etching. When the laminated bonding layer 2 and the bonding layer 4 are brought into contact with each other and subjected to heat treatment, portions of the Ni layer and the second polysilicon layer which are in contact with each other turn into eutectic alloy so that the semiconductor substrate 3 and the cap 5 that are constituted as described above bond with each other. Temperature of this heat treatment for bonding may be set to the eutectic temperature of Ni and silicon in a range from 350 to 500° C., but is preferably at around 400° C. The heat treatment is carried out for a duration ranging from several minutes to several hours depending the processing temperature, in vacuum or inert gas atmosphere. When heat treatment is done in inert gas atmosphere, the pressure in the sealed space is prevented from changing with time so that the pressure in the sealed space can be maintained constant, by setting the ambient pressure in the sealed pressure to the desired pressure.

Since the contact area 7 is formed in the semiconductor device of the first embodiment constituted as described above, the current path 8 is formed in the semi-insulating second polysilicon layer, so that the first polysilicon layer 23 which has electrical conductivity and the bonding layer 4 made of Ti/Ni are electrically connected with each other.

In the semiconductor device of the first embodiment, the first polysilicon layer 23 and the second polysilicon layer 21 contact with each other in a limited area and the insulation layer 22 is formed in other part except for the limited area between the first polysilicon layer 23 and the second polysilicon layer 21, and therefore phosphorus is prevented from diffusing from the first polysilicon layer 23 into the second polysilicon layer 21. As a result, bonding strength of the semiconductor substrate 3 and the cap 5 can be prevented from decreasing in the semiconductor device of the first embodiment.

In the semiconductor device of the first embodiment, as described above, electrical continuity can be established between the first polysilicon layer 23 formed on the semiconductor substrate 3 and the cap 5, and the semiconductor substrate 3 and the cap 5 can be bonded with each other.

According to the semiconductor device of the first embodiment, therefore, such an acceleration sensor can be provided that is capable of suppressing the effect of external noise such as electrostatic or electromagnetic interference without grounding the cap 5 separately from the semiconductor substrate 3.

Embodiment 3

Figure 5:
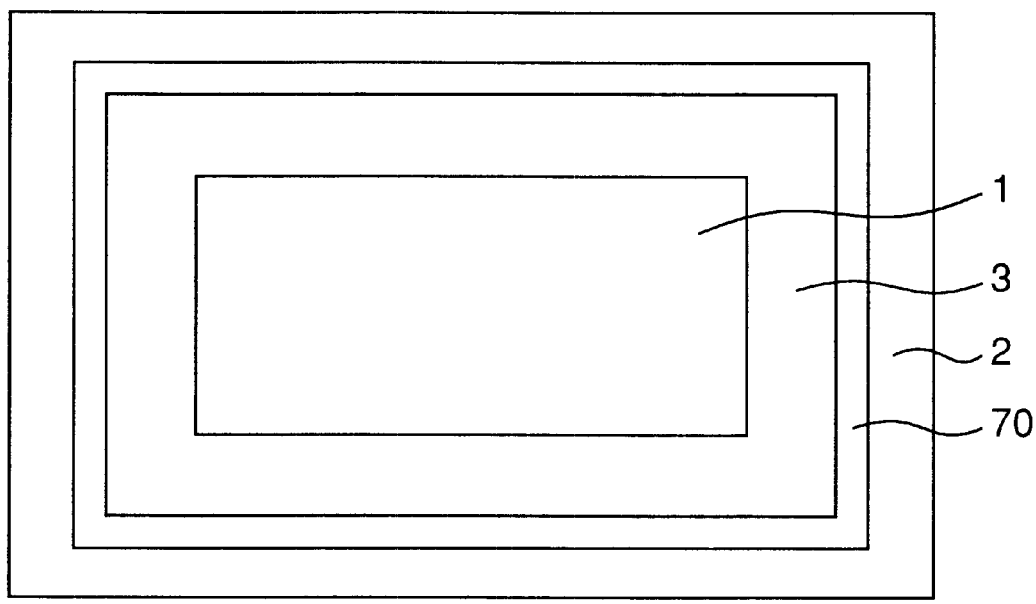
FIG. 5 is a plan view of the semiconductor substrate in the semiconductor device according to the second embodiment of the invention.
Figure 6:
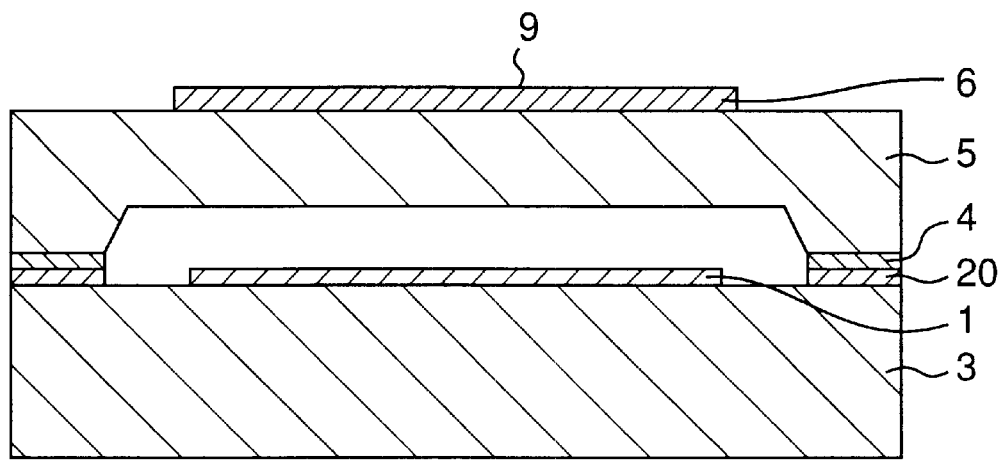
FIG. 6 is a sectional view of the semiconductor device of the prior art.
Figure 7:
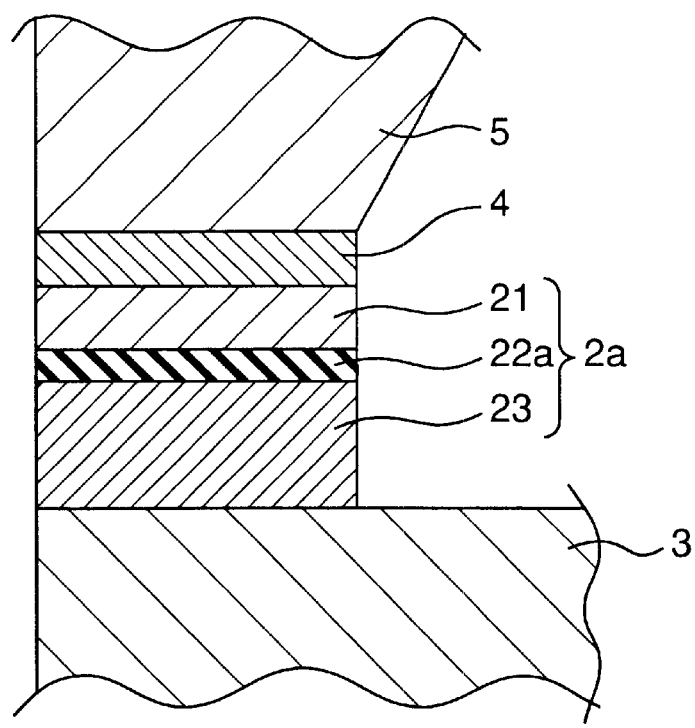
FIG. 7 is a sectional view showing a part of FIG. 6 in an enlarged view.

Now the semiconductor device of the second embodiment will be described below with reference to FIG. 5.

The semiconductor device of the second embodiment is an acceleration sensor having a constitution similar to the semiconductor device of the first embodiment, except for a contact area 70 formed in a ring shape on the inner circumference of the laminated bonding layer 2 instead of the four contact areas 7.

When the ring-shaped contact area 70 is made with a width in a range from 5 to 10 μm, smaller than that of the laminated bonding layer 2 (for example, from 150 to 200

µm) by one order of magnitude or more, sufficient electrical continuity can be ensured between the first polysilicon layer 23 and the cap, thus making it possible to suppress the effect of external noise such as electrostatic or electromagnetic interference without grounding the cap 5 separately from the semiconductor substrate 3.

In the semiconductor device of the second embodiment which is constituted as described above, electrical continuity can be established between the first polysilicon layer 23 formed on the semiconductor substrate 3 and the cap 5, and the semiconductor substrate 3 and the cap 5 can be bonded with each other, similarly to the semiconductor device of the first embodiment.

Also because the semiconductor device of the second embodiment has the contact area 70 formed in the ring shape over the entire inner circumference of the laminated bonding layer 2, electrical continuity can be established between the first polysilicon layer 23 and the cap 5 more reliably than in the case of the semiconductor device of the first embodiment, so that the effect of external noise such as electrostatic or electromagnetic can be prevented more effectively.

As preferable constitution, the contact areas 7 are formed at four positions (corners) of the laminated bonding layer 2 in the first embodiment, and the contact area 70 is formed in ring shape in the second embodiment. Although the invention is not limited to these constitutions and the first polysilicon layer and the second polysilicon layer are required only to contact with each other at least in one portion.

However, according to the present invention, it is preferable that the first polysilicon layer and the second polysilicon layer contact with each other at two or more portions, and more preferably make contact as in the first embodiment and even more preferably as in the second embodiment.

In case contact is made at two or more portions, it is desirable to arrange the contact points at uniform intervals.

Although the first embodiment and the second embodiment concern the acceleration sensors, the present invention is not limited to these embodiments and can be applied to various sensors such as pressure sensor, angular speed sensor and yaw rate sensor, and various devices such as semiconductor integrated circuit.

As described in detail above, the semiconductor device of the present invention has such a constitution as the laminated bonding layer, which is formed on one of the principal planes of the semiconductor substrate that is bonded with the Ni layer of the cap, is constituted from the first polysilicon layer, the insulation layer and the second polysilicon layer being formed one on another, while the first polysilicon layer and the second polysilicon layer contact with each other in a part thereof so that the impurity diffuses through the contact area from the first polysilicon layer to the second polysilicon layer.

In the semiconductor device of the present invention having the constitution described above, since the second polysilicon layer which is not doped with the impurity has a current path formed therein by the impurity which has diffused from the first polysilicon layer, electrical continuity can be established between the conductive first polysilicon layer formed on the semiconductor substrate and the Ni layer of the cap, the effect of external noise such as electrostatic or electromagnetic interference can be suppressed without providing individual grounding for the cap 5 separately from the grounding of the element provided on the semiconductor substrate.

According to the invention, since the insulation layer is formed between the first polysilicon layer and the second polysilicon layer in other part thereof except for the area where the first polysilicon layer and the second polysilicon layer contact with each other, the impurity included in the first polysilicon layer is prevented from diffusing into the second polysilicon layer and satisfactory bonding of the cap and the semiconductor substrate can be made.

In the semiconductor device of the present invention, when the first polysilicon layer and the second polysilicon layer are brought into contact with each other at two or more separate points, it is made possible to achieve more reliable electrical continuity between the first polysilicon layer and the cap, and suppress the effect of external noise such as electrostatic or electromagnetic interference more effectively.

Also in the semiconductor device of the present invention, when the first polysilicon layer and the second polysilicon layer are brought into contact with each other through a ring-shaped contact area provided on the inner or outer circumference of the laminated bonding layer, it is made possible to reduce the resistance of the current path between the first polysilicon layer and the cap, and suppress the effect of external noise such as electrostatic or electromagnetic interference more effectively.

Also when the semiconductor device of the present invention has such a constitution as the element includes a polysilicon layer, this polysilicon layer and the first polysilicon layer can be formed in the same process, thus making it possible to simplify the manufacturing process and manufacture the device at a lower cost.

In the semiconductor device of the present invention, when the cap is made of silicon, the recess to provide the sealed space can be formed easily with a high dimensional accuracy by using anisotropic etching.

What is claimed is:

1. A semiconductor device comprising;
a semiconductor substrate having an upper surface and lower surface,
an element formed on said upper surface and
a cap for sealing said element so as to form a space over said element,
wherein said element is sealed by bonding a laminated rig bonding layer formed around said element provided on said upper surface and an Ni layer formed on said cap,
wherein said laminated bonding layer is constituted from a first polysilicon layer doped with an impurity on said upper surface, an insulation layer on said first polysilicon layer and a second polysilicon layer which is not doped with an impurity on said insulation layer, said first polysilicon layer and said second polysilicon layer being contact with each other in a part thereof so that the impurity diffuses through the contact area from the first polysilicon layer into the second polysilicon layer.

2. The semiconductor device according to claim 1;
wherein said first polysilicon layer and said second polysilicon layer contact with each other at two or more separate points.

3. The semiconductor device according to claim 1;
wherein said laminated bonding layer is provided so as to surround the element and said first polysilicon layer and said second polysilicon layer contact with each other through a ring-shaped contact area provided on the inner or outer circumference of the laminated bonding layer.

4. The semiconductor device according to claim 1;
wherein said element includes a polysilicon layer, said polysilicon layer and said first polysilicon layer being formed in the same process.

5. The semiconductor device according to claim 1;
wherein said cap is made of silicon.

* * * * *